(12) United States Patent
Owada

(10) Patent No.: US 9,087,873 B2
(45) Date of Patent: Jul. 21, 2015

(54) SEMICONDUCTOR DEVICE MANUFACTURING METHOD

(71) Applicant: FUJITSU SEMICONDUCTOR LIMITED, Yokohama-shi, Kanagawa (JP)

(72) Inventor: Tamotsu Owada, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/306,923

(22) Filed: Jun. 17, 2014

(65) Prior Publication Data
US 2015/0014820 A1 Jan. 15, 2015

(30) Foreign Application Priority Data

Jul. 11, 2013 (JP) ................................. 2013-145737

(51) Int. Cl.
*H01L 21/762* (2006.01)
*H01L 29/06* (2006.01)
(52) U.S. Cl.
CPC ...... *H01L 21/76251* (2013.01); *H01L 29/0657* (2013.01)
(58) Field of Classification Search
USPC .......................................... 257/622; 438/106
See application file for complete search history.

(56) References Cited

U.S. PATENT DOCUMENTS

| 4,016,593 | A | * | 4/1977 | Konishi et al. ................ 257/116 |
| 4,268,537 | A | * | 5/1981 | Goodman ...................... 438/589 |
| 5,003,361 | A | * | 3/1991 | Lancaster ...................... 257/299 |
| 6,100,577 | A | * | 8/2000 | Linliu ............................ 257/622 |
| 6,958,298 | B2 | | 10/2005 | Murayama |
| 7,195,988 | B2 | | 3/2007 | Nemoto et al. |
| 7,476,955 | B2 | * | 1/2009 | Street et al. .................... 257/434 |
| 7,709,932 | B2 | | 5/2010 | Nemoto et al. |
| 8,823,148 | B2 | * | 9/2014 | Ota et al. ....................... 257/656 |
| 2002/0163059 | A1 | * | 11/2002 | Hamerski ...................... 257/592 |
| 2012/0293586 | A1 | * | 11/2012 | Law et al. ....................... 347/54 |

FOREIGN PATENT DOCUMENTS

| JP | 2004-349649 A | 12/2004 |
| JP | 2005-026413 A | 1/2005 |
| JP | 2005-277103 A | 10/2005 |

* cited by examiner

*Primary Examiner* — Thao P Le
(74) *Attorney, Agent, or Firm* — Westerman, Hattori, Daniels & Adrian, LLP

(57) ABSTRACT

A recessed portion is formed around an outer edge of a device wafer at a peripheral edge portion of a first face of the device wafer. A recessed portion is formed around an outer edge of a support substrate, at a bonding face of the support substrate. The first face of the device wafer and the bonding face of the support substrate are bonded together by an adhesive. The device wafer is ground from a second face side, on the opposite side to the first face 11, as far as a depth position to reach a bottom face of the recessed portion.

10 Claims, 14 Drawing Sheets

PERIPHERAL EDGE PORTION (EDGE ZONE)    INNER PERIPHERAL PORTION (CENTER ZONE)

US 9,087,873 B2

SEMICONDUCTOR DEVICE MANUFACTURING METHOD

CROSS-REFERENCE TO RELATED APPLICATION

This application is based upon and claims the benefit of priority of the prior Japanese Patent Application No. 2013-145737, filed on Jul. 11, 2013, the entire contents of which are incorporated herein by reference.

FIELD

The embodiments discussed herein are related to a semiconductor device manufacturing method and a support substrate-attached wafer.

BACKGROUND

Three-dimensional packaging technology that stacks plural semiconductor chips in a semiconductor chip thickness direction is known as a form of technology that is breaking the boundaries for miniaturization in Large Scale Integration (LSI). In three-dimensional packaging technology, packaging technology is being researched in which Through Silicon Vias (hereafter referred to as TSVs) are used to form an electrical connection between the stacked semiconductor chips. Implementing three-dimensional packaging using TSVs enables connection with the shortest distance between the stacked chips, thereby enabling high speed operation and reduced power consumption.

In a manufacturing process of a device including TSVs, treatment to expose the TSVs that are embedded in silicon at a chip back face side is performed by thinning a device wafer by grinding from a back face side. Moreover, thinning of the device wafer is also important from the viewpoint of reducing the thickness of a package to which three-dimensional packaging technology is applied. Device wafers are sometimes ground down to a thickness in the region of several tens of μm, and in such cases, the device wafer is unable to be self-supporting, making handling difficult in each process after thinning. As a result, technology known as temporary bonding is employed in which a support substrate is stuck to the device wafer in order to temporarily support the device wafer.

Technology such as that listed below has been proposed regarding semiconductor device manufacturing processes including device wafer grinding treatment. For example, technology has been proposed in which a step is formed at a peripheral edge portion of a front face side of a device wafer, and a support substrate is stuck to the front face of the device wafer using an adhesive, after which the device wafer is ground from a back face side until the step disappears.

Moreover, technology has been proposed in which protective tape adheres to a beveled portion on a front face side of a device wafer when the device wafer that has the protective tape stuck to the front face side is mounted on a processing stage and a back face side of the device wafer is ground.

RELATED PATENT DOCUMENT

Japanese Patent Application Laid-Open (JP-A) No. 2005-26413
JP-A No. 2005-277103
JP-A No. 2004-349649

SUMMARY

According to an aspect of the embodiments, a semiconductor device manufacturing method, includes: forming a first recessed portion around an outer edge of a device wafer, at a peripheral edge portion of a first face of the device wafer; forming a second recessed portion around an outer edge of a support substrate, at a bonding face of the support substrate; bonding together the first face of the device wafer and the bonding face of the support substrate via an adhesive; and grinding the device wafer from a second face side that is at an opposite side to the first face as far as a depth position that reaches a bottom face of the first recessed portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
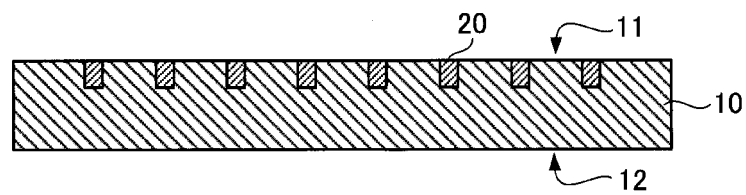
FIG. 1A to FIG. 1F are cross-section views illustrating a semiconductor device manufacturing method according to an exemplary embodiment of technology disclosed herein.

Explanation follows regarding an example of an exemplary embodiment of technology disclosed herein, with reference to the drawings. Note that in each of the drawings, the same reference numerals are attributed to configuration elements and portions that are the same or equivalent.

Figure 2B:
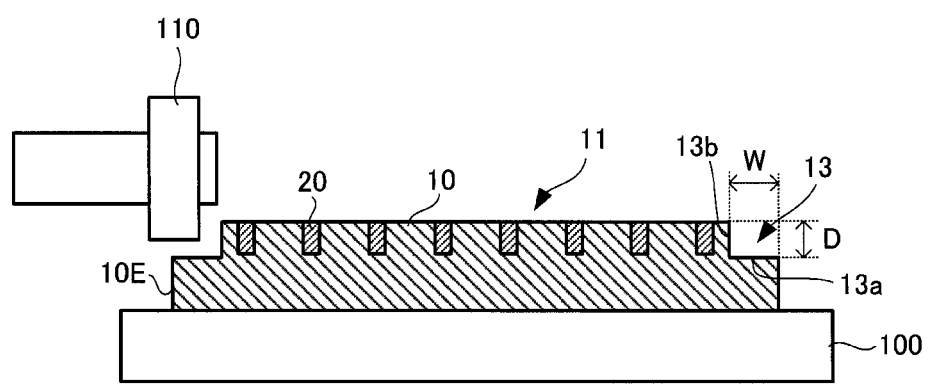
Figure 3A:
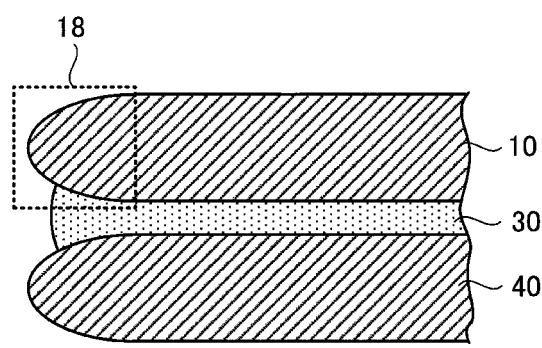
FIG. 3A and FIG. 3B are cross-section views respectively illustrating a device wafer that does not have a recessed portion in a state prior to grinding, and in a state after grinding.
Figure 3B:
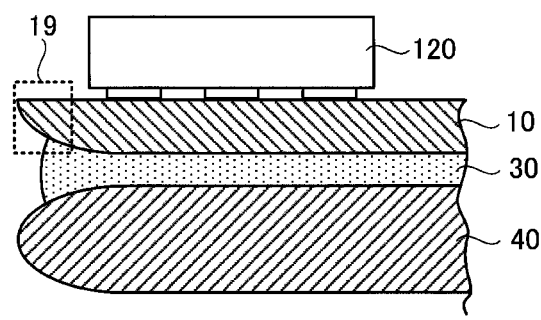

FIG. 3A is a cross-section view of the vicinity of a peripheral edge portion of a device wafer 10 adhered to a support substrate 40 by an adhesive 30. FIG. 3B is a cross-section view illustrating a state after back grinding treatment in which the device wafer 10 illustrated in FIG. 3A is mechanically ground using a grinding wheel 120. As illustrated in FIG. 3A, the device wafer 10 peripheral edge portion includes a beveled portion 18, the thickness of which gradually thins toward an outer edge. When grinding of the peripheral edge portion of the device wafer 10 is performed without having formed a recessed portion 13 such as that illustrated in FIG. 2B, the thickness of the beveled portion 18 becomes even thinner, resulting in a knife edge 19 being generated at an end portion of the device wafer 10, as illustrated in FIG. 3B. The mechanical strength of the knife edge 19 is weak, and is a cause of chipping and cracking.

Figure 4A:
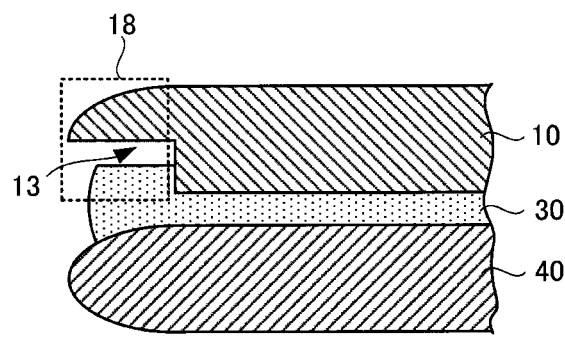
FIG. 4A and FIG. 4B are cross-section views respectively illustrating a device wafer that has a recessed portion in a state prior to grinding, and in a state after grinding.
Figure 4B:
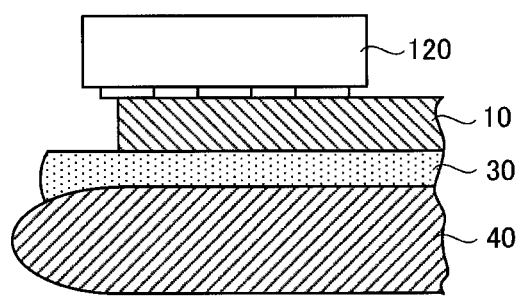

FIG. 4A is a cross-section view of the vicinity of a peripheral edge portion of a device wafer 10 adhered to a support substrate 40 by an adhesive 30, and including a recessed portion 13 at the peripheral edge portion. FIG. 4B is a cross-section view illustrating a state of the device wafer 10 illustrated in FIG. 4A after back grinding treatment. As illustrated in FIG. 4A and FIG. 4B, by forming the recessed portion 13 at the peripheral edge portion of the device wafer 10 prior to grinding treatment of the device wafer 10, the beveled portion 18 that causes the knife edge 19 to occur is removed in advance. This enables generation of a knife edge after grinding treatment of the device wafer 10 to be avoided, and enables occurrence of chipping and cracking to be prevented.

However, the present inventor has discovered that, after a recessed portion is formed so as to form a step at a peripheral edge portion on a front face side of a device wafer, and a support substrate is adhered to the front face of the device wafer using an adhesive, an issue occurs as described below during a process in which the device wafer is ground from a back face side as far as the depth of a bottom face of the recessed portion.

The adhesive interposed between the device wafer and the support substrate flows out into the space formed by the recessed portion formed to the device wafer. Then, in the back grinding treatment in which the device wafer is mechanically ground from the back face side, when the face being ground reaches the bottom face of the recessed portion and the adhesive is exposed to the ground face, the adhesive is ground together with the device wafer. When this occurs, the adhesive exhibits a long thin shaped fibrous form (see FIG. 14B), and in the event that a detached fragment of the fibrous adhesive intrudes between the grinding wheel and the ground face of the device wafer, this causes abnormal grinding, causing damage to the device wafer. Namely, the fibrous adhesive arising from grinding results in chipping or scratch marks occurring on the device wafer.

Moreover, when the adhesive detaches due to grinding of the adhesive at the peripheral edge portion of the device wafer, water supplied from a back grinding device penetrates between the adhesive and the device wafer, and between the adhesive and the support substrate. Due to the ingress of water, force acts to push up the ground face of the device wafer toward the grinding wheel side, causing an increase in friction force of the grinding, and abnormal grinding to occur as a result. In this manner, delamination of the adhesive propagates as far as an inner peripheral portion of the device wafer, and ultimately the support substrate detaches completely from the device wafer, leading to breakage during grinding treatment of the device wafer that has lost its support.

First Exemplary Embodiment

FIG. 1A to FIG. 1F are cross-section drawings illustrating a manufacturing method of a semiconductor device according to an exemplary embodiment of the technology disclosed herein.

Device Forming

Functional components such as semiconductor elements, including transistors, a wiring layer that is electrically connected to the semiconductor elements, and through-silicon via (hereafter referred to as TSV) 20 that are electrically connected to the wiring layer are formed to a first face 11 of a device wafer 10. FIG. 1A illustrates, as an example, the TSVs 20 formed to the device wafer 10. The device wafer, for example, is a silicon wafer with a thickness of 775 μm that has a substantially circular shape. Note that the device wafer 10 is an example of the device wafer of the technology disclosed herein.

The TSVs 20 may be formed using a known TSV forming process. Namely, the TSVs 20 are formed by going through processes such as a process of etching the device wafer 10 from a first face 11 side to form via holes, a process of forming an insulating film on wall faces of the via holes, and a process of forming barrier metal at inner walls of the via holes, and filling a conductor into the barrier metal. The TSVs 20 are formed at a depth equivalent of the ultimate thickness of the device wafer 10 (for example, approximately 50 μm) after being thinned in the later grinding process (see FIG. 1D). Consequently, at the stage illustrated in FIG. 1A, the TSVs 20 do not reach through as far as a second face 12 that is at an opposite side to the first face 11 of the device wafer 10.

Note that the TSVs 20 may be formed by a method named Via First in which the TSVs 20 are formed prior to forming the semiconductor elements. The TSVs 20 may also be formed by a method named Via Middle in which the TSVs 20 are formed after forming the semiconductor elements and prior to forming the wiring layer. Moreover, the TSVs 20 may also be formed by a method named Via Last in which the TSVs 20 are formed after forming the wiring layer. Moreover, in a semiconductor device applied with the technology disclosed herein, in cases in which a silicon interposer is manufactured and employed in order to form an electrically conductive path in the device thickness direction, forming of the semiconductor elements may be omitted. Moreover, in cases in which semiconductor elements are manufactured not requiring an electrically conductive path to be formed in the thickness direction, forming of the TSVs may be omitted. Namely, the technology disclosed herein may also be applied to a device wafer without semiconductor elements such as a transistor, and/or without TSVs.

Recessed Portion Forming

Figure 1B:
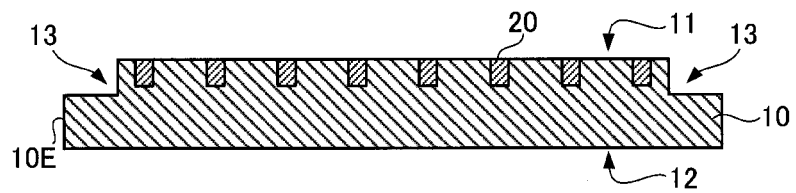
Figure 2A:
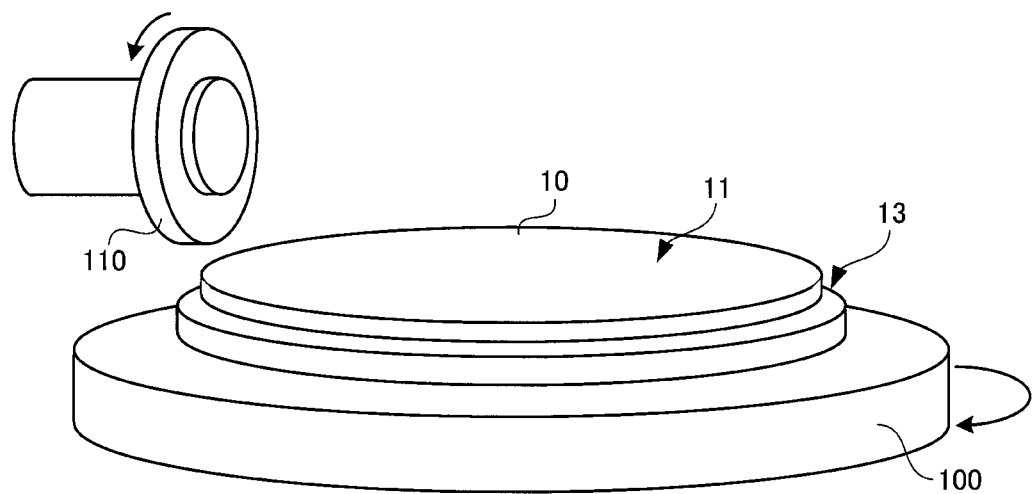
FIG. 2A is a perspective view and FIG. 2B is a cross-section view, both illustrating processing to form a recessed portion to a device wafer according to an exemplary embodiment of technology disclosed herein.

Next, as illustrated in FIG. 1B, a recessed portion 13 that extends in a circular ring shape around the outer edge of the device wafer 10, and that forms a recess toward the second face 12 side is formed to the peripheral edge portion on the first face 11 side of the device wafer 10. Note that the recessed portion 13 is an example of a first recessed portion of the technology disclosed herein. FIG. 2A is a perspective view and FIG. 2B is a cross-section view, each illustrating an example of treatment to form the recessed portion 13 of the device wafer 10. As illustrated in FIG. 2A and FIG. 2B, the device wafer 10 is mounted on a rotating stage 100 such that the first face 11 is facing upward. The recessed portion 13 is formed extending around the outer edge of the device wafer 10 by bringing a trimming blade 110 rotating at high speed into contact with the peripheral edge portion of the first face 11 of the device wafer 10 while rotating the device wafer 10 using the rotating stage 100. As in the example illustrated such as in FIG. 2B, the recessed portion 13 is formed by partially removing the peripheral edge portion of the device wafer 10, including part of an end face 10E of the device wafer 10, such that a cross-section of the recessed portion 13 exhibits an L shape. Namely, the recessed portion 13 includes a bottom face 13a that is connected to the end face 10E of the device wafer 10 and is substantially perpendicular to the end face 10E, and a side face 13b that is connected to the bottom face 13a and is substantially perpendicular to the bottom face 13a. The recessed portion 13 is formed so as to form a circular ring shape around the outer edge of the device wafer 10. Note that the cross-section profile of the recessed portion 13 is not limited to an L shape; a cross-section profile in which the bottom face 13a and side face 13b form a continuous curved face may also be formed.

As an example, a width W (see FIG. 2B) of the recessed portion 13 may be set within a range of from 0.3 mm to 1.0 mm, and may be representatively set at approximately 0.5 mm. As described later, setting the width W of the recessed portion 13 at 0.3 mm or above enables removal of a wafer beveled portion conforming to SEMI standards, and enables prevention of a knife edge from occurring. As an example, a depth D (see FIG. 2B) of the recessed portion 13 may be set at a value that is approximately 30 nm to 100 μm more than the thickness of the device wafer 10 will be after thinning by grinding, and may be set, typically, at a value with approximately 50 μm added. For example, in a case in which the thickness of the device wafer 10 after thinning will be 50 μm, the depth D of the recessed portion 13 may be set at 100 μm. Note that the depth D of the recessed portion 13 forms a space for accommodating an adhesive 30 that is interposed between the device wafer 10 and a support substrate 40, as described later, and therefore may be set as appropriate according to the ultimate thickness of the adhesive 30. A dicing device DFD6860 manufactured by DISCO Corporation, for example, may be used as a device for forming the recessed portion 13. Note that the recessed portion 13 does not rely on grinding, and may also be formed by etching.

Device Wafer and Support Substrate Adhesion

Figure 1C:
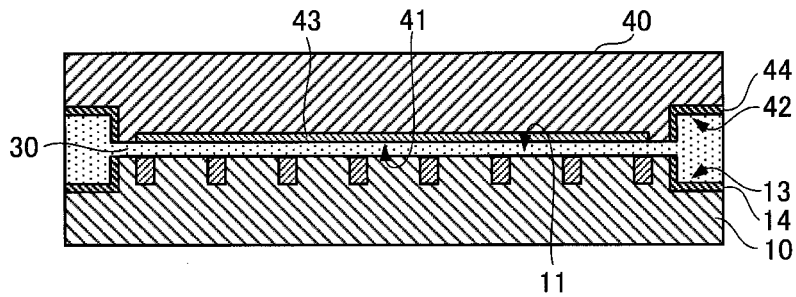

Next, as illustrated in FIG. 1C, the first face 11 of the device wafer 10 is adhered to the support substrate 40 through the adhesive 30.

The support substrate 40 includes a recessed portion 42 that extends in a circular ring shape around an outer edge of the support substrate 40 at a peripheral edge portion on a bonding face 41 side that contacts the adhesive 30. The recessed portion 42 is formed in a position corresponding to the recessed portion 13 of the device wafer 10 side, so as to form an integrated space with the recessed portion 13 on the device wafer 10 side when the support substrate 40 and the device wafer 10 are stuck together. The adhesive 30 interposed between the device wafer 10 and the support substrate 40 is accommodated in the recessed portion 13 on the device wafer 10 side, and in the recessed portion 42 on the support substrate 40 side. Note that the support substrate 40 is an example of a support substrate of the technology disclosed herein, and that the recessed portion 42 of the support substrate 40 side is an example of a second recessed portion of the technology disclosed herein.

Detailed explanation follows regarding each type of treatment executed in a process of bonding together the device wafer 10 and the support substrate 40.

The support substrate 40 has sufficient mechanical strength to support the device wafer 10 that is thinned in a later grinding process (see FIG. 1D). A glass substrate or a silicon substrate, for example, may be suitably employed as the support substrate 40. In the present exemplary embodiment, the support substrate 40 has a substantially circular shape of the same size to that of the device wafer 10. Note that the size of the support substrate 40 may be larger than the size of the device wafer 10.

The support substrate 40 is for temporarily supporting the device wafer 10, and the support substrate 40 is detached from the device wafer 10 in a later detachment process (see FIG. 1F). Although not illustrated in the drawings, the support substrate 40 is detached in a state in which a dicing film is stuck to the ground face of the device wafer 10. In the present exemplary embodiment, prior to bonding the support substrate 40 to the device wafer 10, surface treatment is performed to the bonding face 41 of the support substrate 40 to form a low adhesion layer 43 with reduced adhesion to the adhesive 30. Note that the low adhesion layer 43 is an example of a low adhesion layer of the technology disclosed herein. As an example of the surface treatment to form the low adhesion layer 43, ZoneBOND (registered trademark) technology developed by Brewer Science, Inc. and EV Group may be applied.

Figure 5A:
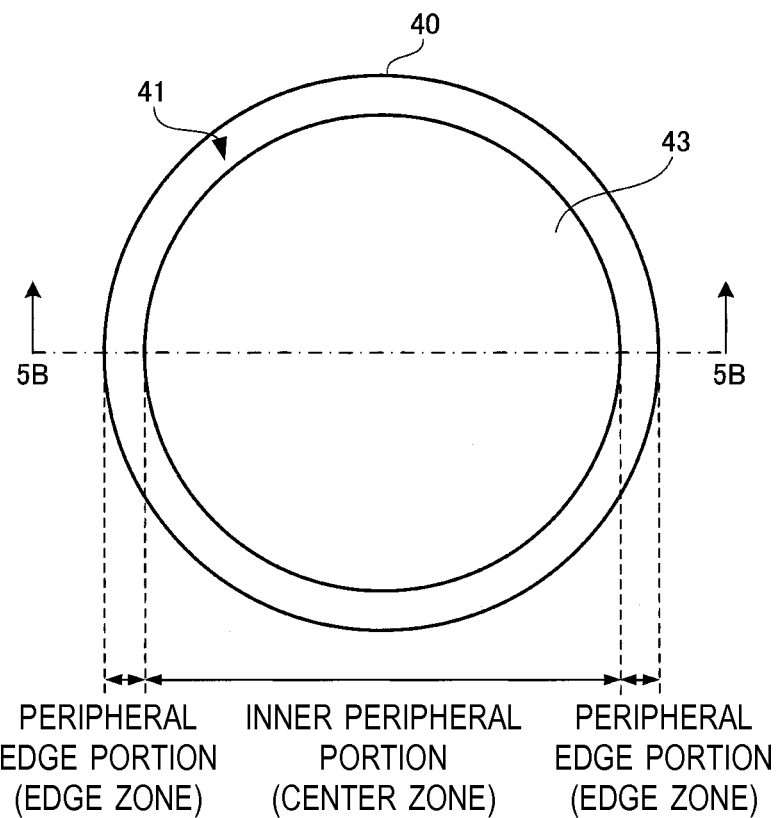
FIG. 5A is a plan view and FIG. 5B is a cross-section view, respectively illustrating a support substrate according to an exemplary embodiment of technology disclosed herein.
Figure 5B:
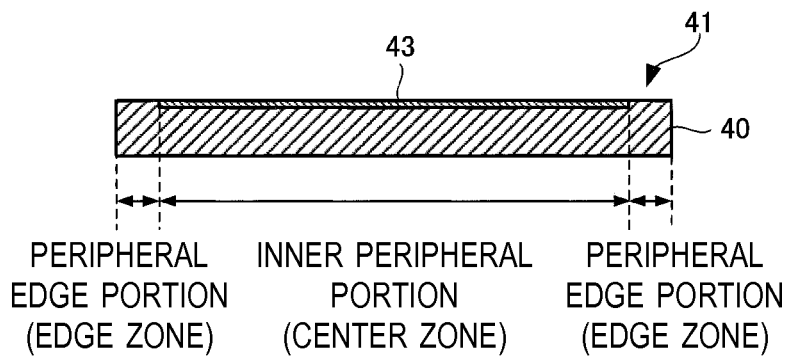

FIG. 5A is a plan view of the bonding face 41 side of the support substrate 40 with the low adhesion layer 43 formed by surface treatment, and FIG. 5B is a cross-section view taken along line 5B-5B in FIG. 5A. Chemical surface treatment is performed at an inner peripheral portion (center zone) of the bonding face 41 of the support substrate 40 that contacts with the adhesive 30 in order to reduce adhesion to the adhesive 30. As a result, the inner peripheral portion of the support substrate 40 is formed with the low adhesion layer 43 with lower adhesion (lower bonding force) to the adhesive 30 than an outer peripheral portion of the support substrate 40. The above surface treatment is not performed to a peripheral edge portion (edge zone) that is further to the outside than the inner peripheral portion of the support substrate 40, thereby securing adhesion to the adhesive 30 at the support substrate 40 peripheral edge portion. Note that the low adhesion layer 43 is not essential, and treatment in order to form the low adhesion layer 43 may be omitted.

Figure 6A:
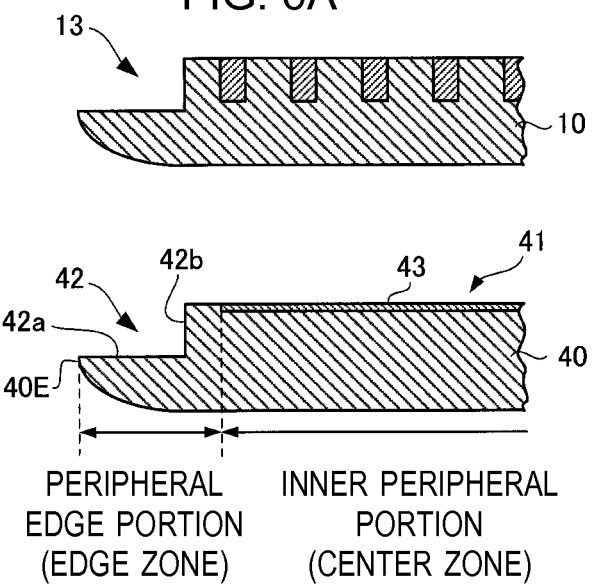
FIG. 6A is a cross-section view of a device wafer and a support substrate after recessed portions have been formed thereto according to an exemplary embodiment of technology disclosed herein.

As illustrated in FIG. 6A, in the manufacturing method according to the present exemplary embodiment, not only is a recessed portion formed to the device wafer 10, but the recessed portion 42 is also formed on the support substrate 40 side. The recessed portion 42 on the support substrate 40 side is formed to the peripheral edge portion (edge zone) that is further to the outside than the inner peripheral portion (center zone), to which the low adhesion layer 43 is formed on the bonding face 41 side of the support substrate 40. As illustrated in the example of FIG. 6A, the recessed portion 42 on the support substrate 40 side is formed by partially removing the peripheral edge portion of the support substrate 40, including part of an end face 40E of the support substrate 40, such that a cross-section exhibits an L shape, similarly to the recessed portion 13 on the device wafer 10 side. Namely, the recessed portion 42 includes a bottom face 42a connected to the end face 40E of the support substrate 40, and a side face 42b that is connected to the bottom face 42a and is substantially perpendicular to the bottom face 42a. The recessed portion 42 is formed so as to form a circular ring shape around the outer edge of the support substrate 40. Note that the cross-section profile of the recessed portion 42 is not limited to an L shape; a cross-section profile in which the bottom face 42a and side face 42b form a continuous curved face may also be formed.

Moreover, although the recessed portion 42 on the support substrate 40 side may be formed with substantially the same width and depth as the recessed portion 13 on the device wafer 10 side, the width and depth are not limited thereto. Namely, it is sufficient that, when the support substrate 40 has been adhered to the device wafer 10, at least one space that is in communication with the space formed by the recessed portion 13 on the device wafer 10 side is formed by the recessed portion 42 on the support substrate 40 side. Note that recessed portion 42 on the support substrate 40 side may be formed prior to forming the low adhesion layer 43, or may be formed after forming the low adhesion layer 43.

The recessed portion 42 on the support substrate 40 side may be formed by using the trimming blade 110 (see FIG. 2A and FIG. 2B) to grind the peripheral edge portion of the support substrate 40 around the outer edge of the support substrate 40, similarly to the recessed portion 13 on the device wafer 10 side. Note that the recessed portion 42 on the support substrate 40 side may also be formed by etching.

Figure 6B:
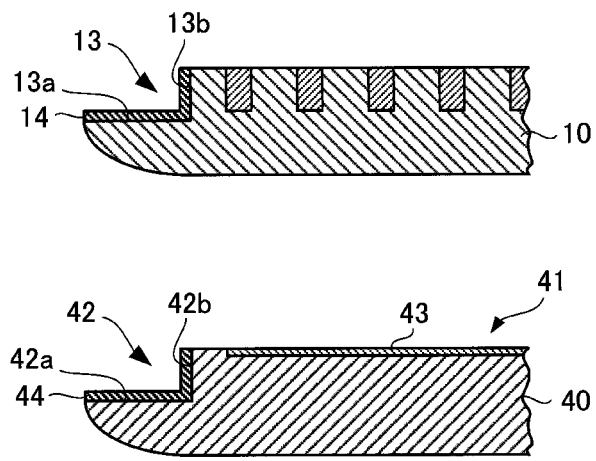
FIG. 6B is a cross-section of the device wafer and the support substrate after adhesion layers have been formed thereto according to an exemplary embodiment of technology disclosed herein.

After the recessed portion 13 and the recessed portion 42 have been formed to the device wafer 10 and the support substrate 40 respectively, as illustrated in FIG. 6B, the surfaces of the recessed portion 13 and the recessed portion 42 are each coated with a silane coupling agent, respectively forming adhesion layers 14, 44. This enables increased adhesion to the adhesive 30 at the surfaces (the bottom face 13a and side face 13b of the recessed portion 13, and the bottom face 42a and side face 42b of the recessed portion 42) of the recessed portion 13 and recessed portion 42. Neither of these adhesion layers 14, 44 are essential, and formation of either or both of the adhesion layer 14 or the adhesion layer 44 may be omitted. Note that the adhesion layer 14 is an example of a second adhesion layer of the technology disclosed herein, and the adhesion layer 44 is an example of a first adhesion layer of the technology disclosed herein.

The silane coupling agent is an organosilicon compound that contains both an organic functional group that may be expected to react and interact with an organic substance inside a single molecule, and a hydrolysable group. The silane coupling agent plays a role of forming a chemical bond between the adhesive 30, that is an organic material, and the device wafer 10, or the support substrate 40, that are inorganic materials, by reacting the hydrolysable group with the adhesive 30 through the organic functional group. The adhesion (bonding force) is thereby increased between the adhesive 30, and the device wafer 10 or the support substrate 40, that have different chemical properties. Examples of the organic functional group include an amino group, an epoxy group, a methacryl group, a vinyl group and a mercapto group. Examples of a hydrolysable group include —$OCH_3$, —$OC_2H_5$ and —$OCOCH_3$. Z-6043, manufactured by Dow Corning Corporation, that includes a cyclic epoxy group as an organic functional group, and a methoxy group as a hydrolysable group, may be used as a silane coupling agent. Moreover, Z-6011, manufactured by Dow Corning Corporation, that includes an amino group as an organic functional group, and a methoxy group as a hydrolysable group, may also be used as a silane coupling agent.

Figure 7:
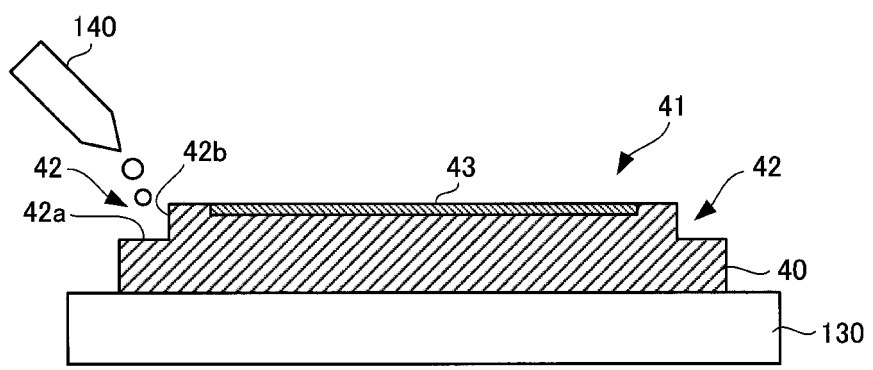
FIG. 7 is a cross-section view illustrating processing to form an adhesion layer according to an exemplary embodiment of technology disclosed herein.

FIG. 7 is a cross-section view illustrating an example of treatment for forming the adhesion layer 44 on the surfaces (the bottom face 42a and the side face 42b of the recessed portion 42) of the recessed portion 42 of the support substrate 40. As illustrated in FIG. 7, the support substrate 40 to which the recessed portion 42 is formed is mounted on a rotating stage 130 of a spin coater, such that the bonding face 41 side faces upward. Then, in a state in which the support substrate 40 is rotated by the rotating stage 130 at for example 50 rpm, the silane coupling agent is dripped from a nozzle 140 that is disposed above the peripheral edge portion of the support substrate 40. The bottom face 42a and side face 42b of the recessed portion 42 are thereby coated with the silane coupling agent. The revolutions of the rotating stage 130 are set such that the silane coupling agent that is fed onto the surfaces of the recessed portion 42 does not spread upward from the recessed portion 42 and overflow onto the low adhesion layer 43, thereby enabling excellent control of selective forming of the adhesion layer 44 on the surfaces of the recessed portion 42.

After coating the surface of the recessed portion 42 with the silane coupling agent, the support substrate 40 is mounted on, for example, a hot plate at 100° C. for approximately 15 minutes. As the silane coupling agent dries due to the heat treatment applied, the organic function group of the silane coupling agent is oriented toward the surface of the recessed portion 42, and the adhesion layer 44 that has a high level of adhesion to the adhesive 30 is formed (see FIG. 6B). Note that the adhesion layer 14 on the device wafer 10 side may also be formed by a similar treatment to that of the above treatment employed for formation of the adhesion layer 44 on the support substrate 40 side.

Figure 8A:
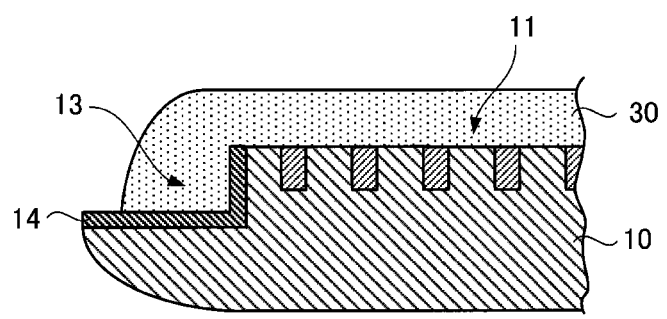
FIG. 8A is a cross-section view of a device wafer after application of an adhesive according to an exemplary embodiment of technology disclosed herein.

Next, as illustrated in FIG. 8A, the adhesive 30 is applied to the first face 11 of the device wafer 10 to which the recessed portion 13 and the adhesion layer 14 are formed, using, for example, a spin coating method. ZoneBOND 5150 manufactured by Brewer Science, Inc. may be used as the adhesive 30. Note that the film formation conditions (such as the revolutions for spin coating, and the amount of adhesive 30 supplied) of the adhesive are set appropriately according to the target thickness of the adhesive 30 after adhesion of the device wafer 10 and the support substrate 40. As an example, the target thickness of the adhesive 30 after adhesion of the device wafer 10 and the support substrate 40 may be set within a range of 30 μm to 50 μm. After applying the adhesive 30 to the first face 11 of the device wafer 10, the adhesive 30 is pre-baked by performing heat treatment on the device wafer 10.

Figure 8B:
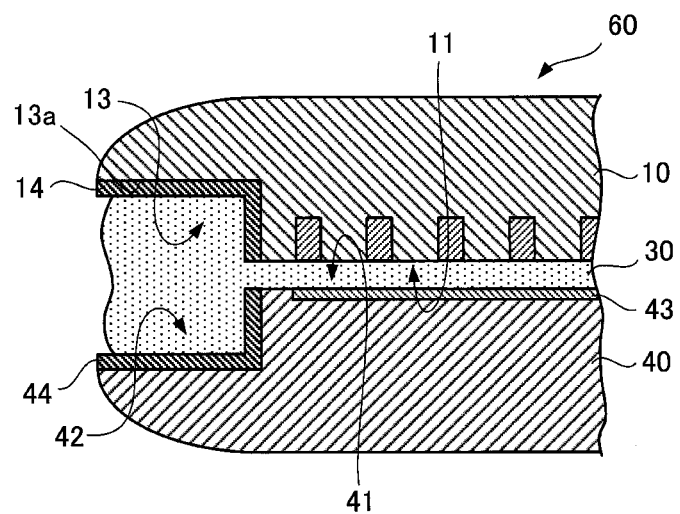
FIG. 8B is a cross-section view of a device wafer that is adhered to a support substrate (a support substrate-attached wafer) according to an exemplary embodiment of technology disclosed herein.

Next, as illustrated in FIG. 8B, the support substrate 40 to which the recessed portion 42, the low adhesion layer 43 and the adhesion layer 44 are formed is stuck together with the first face 11 of the device wafer 10 to which the adhesive 30 is applied. Specifically, the support substrate 40 is set on a chucking stage of a wafer bonding device, not illustrated in the drawings, such that the bonding face 41 faces upwards. Next, the device wafer 10 is disposed above the support substrate 40 in a state with the first face 11 facing downward, and the device wafer 10 is then overlaid on top of the support substrate 40, while aligning the device wafer 10 with respect to the support substrate 40. The device wafer 10 and the support substrate 40 are thereby stuck together in a state in which the first face 11 of the device wafer 10 and the bonding face 41 of the support substrate 40 face each other. Next, in the stuck-together-state of the device wafer 10 and the support substrate 40, heat treatment is performed for approximately 1 minute to 10 minutes within a temperature range of from 180° C. to 250° C., for example, while the wafer bonding device is applying pressure to the device wafer 10 and the support substrate 40. The structure configured by the device wafer 10 and the support substrate 40 stuck together by the adhesive 30 is hereafter referred to as a support substrate-attached wafer 60.

The device wafer 10 and the support substrate 40 are stuck together by the pressure applied by the wafer bonding device. The adhesive 30 placed between the device wafer 10 and the support substrate 40 is also accommodated inside the recessed portion 42, enabling the amount of adhesive 30 inside the recessed portion 13 of the device wafer 10 to be decreased compared to a case in which there is no recessed portion formed to the support substrate 40. Moreover, the recessed portion 42 also accommodates the adhesive 30, enabling the adhesive 30 to be prevented from encroaching on the beveled portions of the device wafer 10 and the support substrate 40.

In cases in which the adhesion layers 14, 44 are formed to the surfaces of the recessed portions 13, 42, the adhesive 30 formed inside the recessed portions 13, 42 adheres to the device wafer 10 and the support substrate 40 with a high level of adhesion. Namely, the device wafer 10 and the support substrate 40 are firmly adhered to each other at a peripheral edge portion of the support substrate-attached wafer 60.

Performing each of the above treatments completes adhesion of the device wafer 10 and the support substrate 40, and the device wafer 10 and the support substrate 40 are stuck together by the adhesive 30 to form the support substrate-attached wafer 60. Note that the support substrate-attached wafer 60 is an example of a support substrate-attached wafer of the technology disclosed herein.

Device Wafer Grinding

Figure 1D:
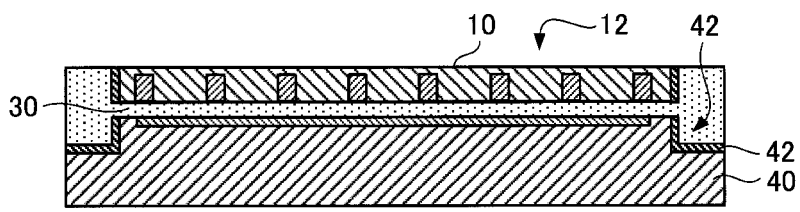
Figure 9:
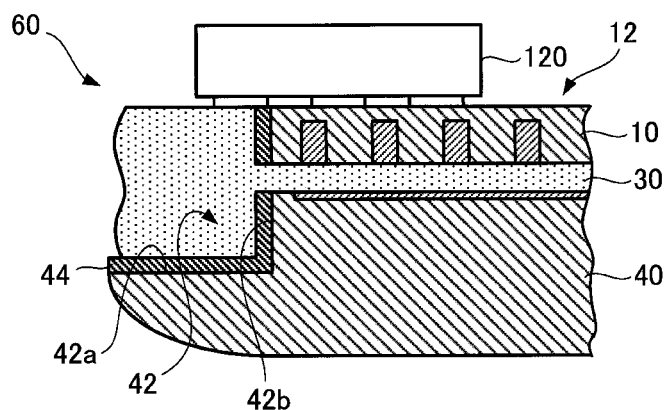
FIG. 9 is a cross-section view illustrating grinding processing of a support substrate-attached wafer according to an exemplary embodiment of technology disclosed herein.

Next, as illustrated in FIG. 1D, the device wafer 10 that is supported by the support substrate 40 is thinned by grinding from the second face 12 side. FIG. 9 is a cross-section view illustrating an example of grinding treatment of the device wafer 10. For example, back grinding treatment is performed in which the grinding wheel 120 is brought into contact with the second face 12 of the device wafer 10 and mechanical grinding is performed. This grinding is performed such that the ground face of the device wafer 10 reaches the bottom face 13a of the recessed portion 13 (see FIG. 8B). When the ground face has reached the bottom face 13a of the recessed portion 13 and the adhesive 30 is exposed at the ground face, the adhesive 30 is ground together with device wafer 10. Since a reduction can be achieved in the amount of adhesive 30 inside the recessed portion 13 formed to the device wafer 10 compared to a case in which there is no recessed portion formed to the support substrate 40, the adhesive 30 can be suppressed from becoming fibrous during grinding, or the size of any fibrous adhesive 30 can be suppressed. In cases in which the adhesion layer 44 that covers the bottom face 42a and the side face 42b of the recessed portion 42 is formed, the adhesive 30 is prevented from detaching from the support substrate 40 due to friction force during grinding.

Device Wafer Back Face Processing

Figure 1E:
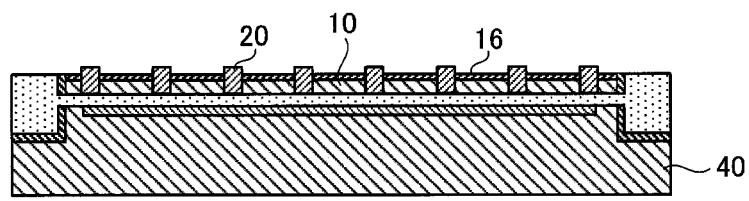

Next, as illustrated in FIG. 1E, various processing is performed on the second face 12 side of the device wafer 10. For example, the present process may include a silicon recess process in which the device wafer 10 is eroded from the second face 12 by etching to prepare to the ultimate device thickness, and to expose the end portions of the TSVs 20 from the second face 12 side. Furthermore, the present process may include such processes as a process of forming a passivation film 16 on the second face 12 of the device wafer 10, a process of removing a barrier metal (not illustrated in the drawings) at exposed portions of the TSVs 20, or a process of forming a wiring layer that is electrically connected to the TSVs 20.

Support Substrate Separation

Figure 1F:
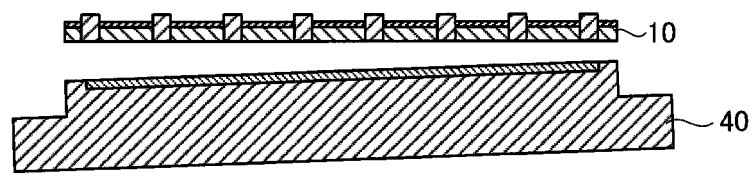
Figure 10A:
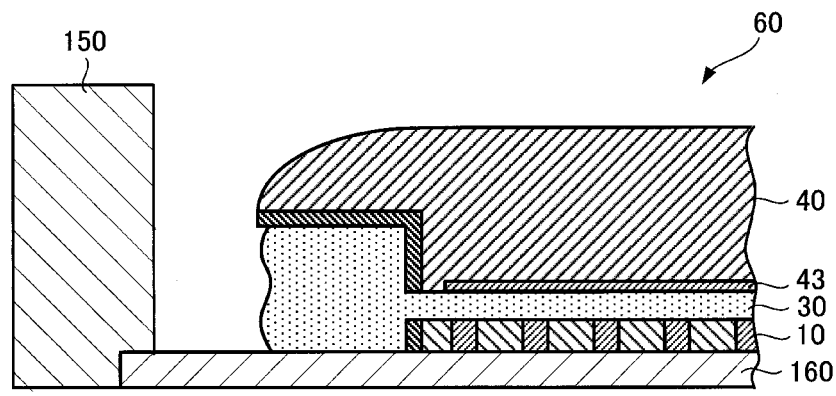
FIG. 10A to FIG. 10C are cross-section views illustrating processing to detach a support substrate according to an exemplary embodiment of technology disclosed herein.
Figure 10B:
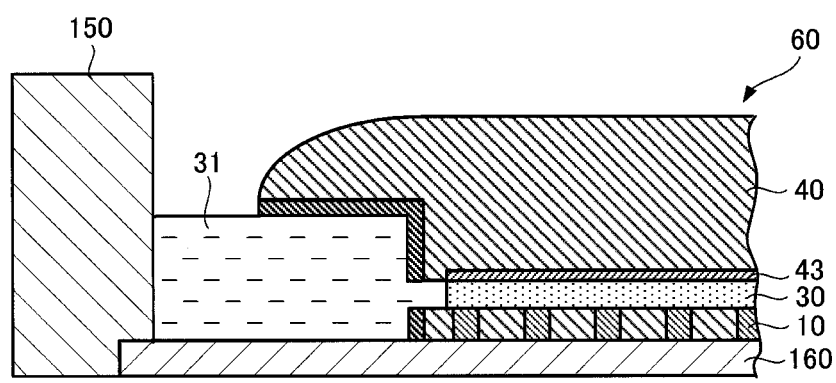
Figure 10C:
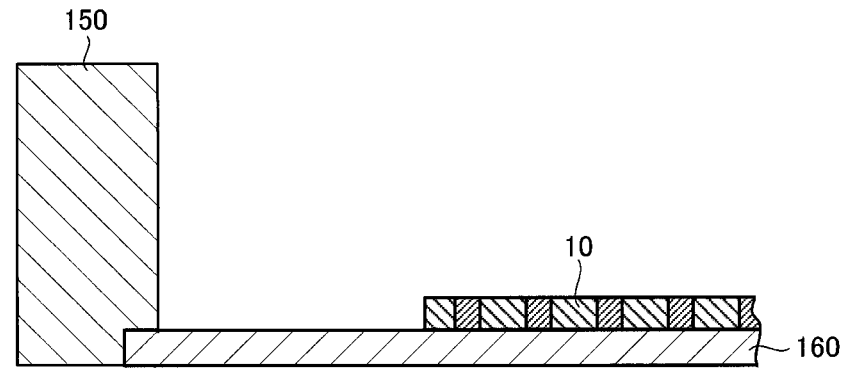

Next, as illustrated in FIG. 1F, the support substrate 40 is separated from the device wafer 10 that has completed back face processing. FIG. 10A to FIG. 10C are cross-section views illustrating an example of treatment for separating the support substrate 40 from the device wafer 10.

First, as illustrated in FIG. 10A, a dicing film 160 that is attached to a ring frame 150 is stuck to the device wafer 10 side of the support substrate-attached wafer 60. The dicing film 160 plays the role of a support body for the device wafer 10 after detachment from the support substrate 40, and also supports the device wafer 10 as it is diced into chips in a later dicing process.

Next, as illustrated in FIG. 10B, a solvent (remover) 31 that dissolves the adhesive 30 is supplied to a space between the ring frame 150 and the support substrate-attached wafer 60. Since the adhesive 30 is exposed at edge faces of the support substrate-attached wafer 60, the dissolving of the adhesive 30 progresses from the peripheral edge portion toward an inner peripheral portion of the support substrate-attached wafer 60. As illustrated in FIG. 10B, at a stage when dissolving of the adhesive 30 has reached the portion formed with the low adhesion layer 43, the support substrate-attached wafer 60 is inserted into a carrier debonder (not illustrated in the drawings) while still in the stuck-on state to the dicing film 160. The dicing film 160 is then suction adhered to a stage while the support substrate 40 is clamped by the carrier debonder, and force is made to act in a direction to separate the support substrate 40 from the dicing film 160. As illustrated in FIG. 10C, the support substrate 40 is thereby detached from the device wafer 10. At a stage at which the adhesive 30 is in a contact state with the support substrate 40 side at the low adhesion layer 43 only, the support substrate 40 can be separated by applying force. The device wafer 10, from which the support substrate 40 has been removed, is supported by the dicing film 160. Note that cleaning treatment of the device wafer 10 may be performed in cases in which residue of the adhesive 30 is present on the device wafer 10.

Figure 11:
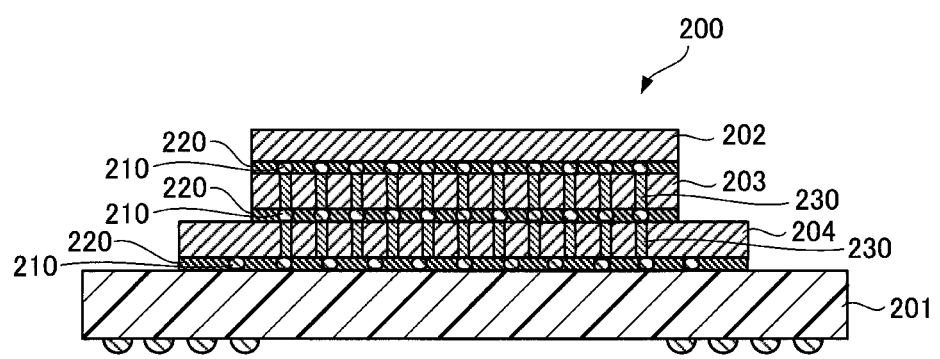
FIG. 11 is a cross-section view illustrating an example of a semiconductor package that includes a semiconductor device according to an exemplary embodiment of technology disclosed herein.

The device wafer 10 is then cut into individual chips in the dicing process, and mounted or accommodated in a package. FIG. 11 is a cross-section view illustrating an example of a semiconductor package in which a semiconductor device manufactured using the manufacturing method according to the present exemplary embodiment is packaged using three-dimensional packaging technology. The semiconductor package 200 includes a resin substrate 201 with multilayered wiring (not illustrated in the drawings) inside, and semiconductor chips 202, 203, 204 that are manufactured using the manufacturing method according to the present exemplary embodiment and are stacked on the resin substrate 201. The semiconductor chips 202 to 204 are connected to adjacent semiconductor chips or to the resin substrate 201 through solder bumps 210. Underfill 220 is filled between each of the semiconductor chips and into the space between the semiconductor chip 204 and the resin substrate 201. TSVs 230 are formed within both the middle tier semiconductor chip 203 and the lower tier semiconductor chip 204, thereby forming electrically conductive paths along the stacking direction of the semiconductor chips 202 to 204. The semiconductor chips 202 to 204 are each thinned to approximately 50 µm, for example, in the above grinding process, thereby achieving a thin semiconductor package 200.

As is clear from the above explanation, in the semiconductor device manufacturing method according to the present exemplary embodiment, the recessed portion 13 is formed around the outer edge of the device wafer 10 at the peripheral edge portion on the first face 11 side of the device wafer 10. This enables a knife edge to be prevented from occurring accompanying grinding of the device wafer 10.

Moreover, in the semiconductor device manufacturing method according to the present exemplary embodiment, the recessed portion 42 is formed to the support substrate 40. The adhesive 30 interposed between the device wafer 10 and the support substrate 40 is also accommodated in the recessed portion 42 on the support substrate 40 side. As a result, the amount of adhesive 30 that is accommodated in the recessed portion 13 formed to the device wafer 10 can be reduced. The adhesive 30 accommodated inside the recessed portion 13 is thereby suppressed from becoming fibrous when the adhesive 30 is being ground during grinding of the device wafer 10, enabling avoidance of damage to the device wafer 10 due to abnormal grinding Moreover, in cases in which the adhesion layer 44 is formed to surfaces of the recessed portion 42 formed on the support substrate 40 side, the adhesive 30 inside the recessed portion 42 adheres to the support substrate 40 through the adhesion layer 44, enabling detachment of the adhesive 30 during grinding of the device wafer 10 to be suppressed.

Moreover, in cases in which the adhesion layer 14 is formed to surfaces of the recessed portion 13 on the device wafer 10 side, this enables the adhesion strength between the device wafer 10 and the support substrate 40 to be increased at the peripheral edge portion of the support substrate-attached wafer 60, enabling the risk of the support substrate 40 separating from the device wafer 10 in later processes to be reduced.

Moreover, in the present exemplary embodiment, the recessed portion 13 and the recessed portion 42 are each formed by removing regions that include end faces that form the outer edges of the device wafer 10 and the support substrate 40, respectively. This enables the surface area of the adhesive 30 exposed at edge portions of the support substrate-attached wafer 60 to be enlarged compared to a structure in which there is no recessed portion 42 on the support substrate 40 side. This enables a reduction in processing time when dissolving the adhesive 30 using the solvent (remover) 31 during the process to separate the support substrate 40.

Second Exemplary Embodiment

Figure 12A:
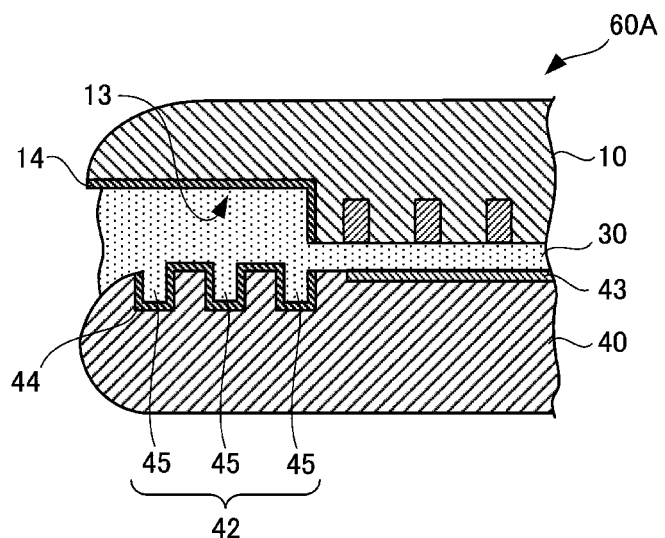
FIG. 12A and FIG. 12B are cross-section views each illustrating a support substrate-attached wafer according to a second exemplary embodiment of technology disclosed herein.
Figure 12B:
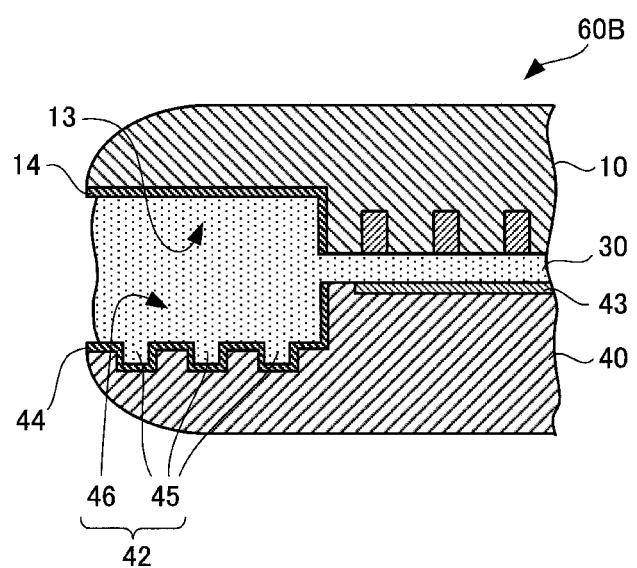

FIG. 12A and FIG. 12B are cross-section views respectively illustrating configurations of support substrate-attached wafers 60A, 60B according to a second exemplary embodiment of the technology disclosed herein. The support substrate-attached wafers 60A, 60B according to the second exemplary embodiment differ from the first exemplary embodiment in the configuration of the recessed portion 42 formed on the support substrate 40 side. Namely, a recessed portion 42 formed to a support substrate 40 according to the second exemplary embodiment includes plural grooves 45 that extend in a concentric circle shape around an outer edge of the support substrate 40 at a peripheral edge portion of the support substrate 40.

In the example illustrated in FIG. 12A, the plural grooves 45 are provided in the same plane as the plane in which a low adhesion layer 43 of the support substrate 40 is formed. In the example illustrated in FIG. 12B, the plural grooves 45, narrower in width than a recessed portion 46, are provided to a bottom face of the comparatively wide recessed portion 46 that is formed to the peripheral edge portion of the support substrate 40. In the examples illustrated in FIG. 12A and FIG. 12B, an adhesion layer 44 is formed by coating surfaces of the plural grooves 45 with a silane coupling agent. Note that the adhesion layer 44 may be formed as required.

The plural grooves 45 may be formed, for example, by employing a trimming blade that is appropriate for the width of the grooves 45, and grinding the support substrate 40 while sequentially moving the trimming blade in a support substrate 40 radial direction. The plural grooves 45 may also be formed by etching.

Note that, in the support substrate-attached wafers 60A, 60B according to the second exemplary embodiment, configuration on a device wafer 10 side is similar to that of the first exemplary embodiment described above, therefore explanation of the device wafer 10 side is omitted.

An uneven structure is thereby formed at the peripheral edge portion of the support substrate 40 by including the plural grooves 45 in the recessed portion 42 on the support substrate 40 side. As a result, the contact surface area between the support substrate 40 and the adhesive 30 at the peripheral edge portion of the support substrate 40 is increased compared to the first exemplary embodiment. This enables the adhesion between the adhesive 30 and the support substrate 40 to be further increased, and enables further promotion of the effect of preventing the adhesive 30 from detaching during grinding of the device wafer 10.

Third Exemplary Embodiment

Figure 13:
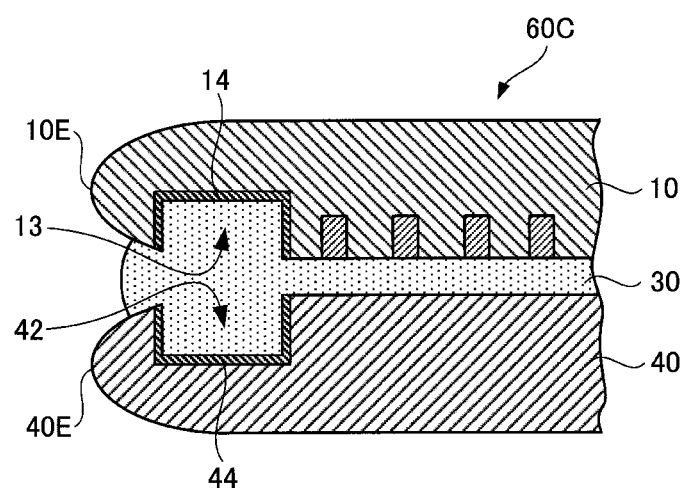
FIG. 13 is a cross-section view illustrating a wafer with a support substrate according to a third exemplary embodiment of technology disclosed herein.

FIG. 13 is a cross-section view illustrating a configuration of a support substrate-attached wafer 60C according to a third exemplary embodiment of the technology disclosed herein. In the support substrate-attached wafer 60 according to the first exemplary embodiment (see FIG. 8B), the recessed portions 13, 42 formed to the device wafer 10 and the support substrate 40, respectively, are formed by partially removing regions including the end faces of the device wafer 10 or the support substrate 40. Namely, the cross-section profiles of the recessed portions 13, 42 according to the first exemplary embodiment exhibit L shapes. In contrast, in the support substrate-attached wafer 60C according to the third exemplary embodiment, a recessed portion 13 on a device wafer 10 side is shaped by partially removing a region that is further inward than an end face 10E of the device wafer 10. Namely, a cross-section profile of the recessed portion 13 on the device wafer 10 side according to the third exemplary embodiment exhibits a U shape. Similarly, in the support substrate-attached wafer 60C according to the third exemplary embodiment, a recessed portion 42 on a support substrate 40 side is formed by partially removing a region that is further inward than an end face 40E of the support substrate 40. Namely, a cross-section profile of the recessed portion 42 on the support substrate 40 side according to the third exemplary embodiment exhibits a U shape.

Forming the recessed portions 13, 42 in this way enables an enhanced effect of preventing adhesive 30 filled into a space formed by the recessed portions 13, 42 from encroaching on faces on opposite sides to bonding faces of the device wafer 10 and the support substrate 40.

Note that different combinations of the device wafers 10 and the support substrates 40 according to the first to the third exemplary embodiments described above may form the support substrate-attached wafer. For example, the support substrate 40 according to the second exemplary embodiment and the device wafer 10 according to the third exemplary embodiment may be combined to form a support substrate-attached wafer. Moreover, the support substrate 40 according to the first exemplary embodiment and the device wafer 10 according to the third exemplary embodiment may also be combined to form a support substrate-attached wafer.

Comparative Example

Figure 14A:
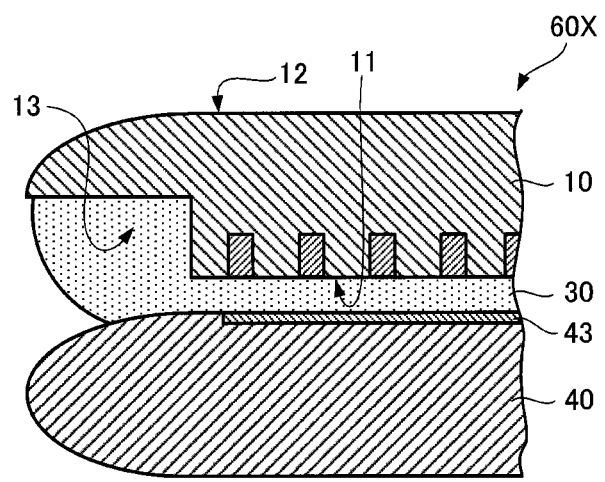
FIG. 14A is a cross-section view of a device wafer adhered to a support substrate (a support substrate-attached wafer) according to a Comparative Example.

FIG. 14A is a cross-section view of a support substrate-attached wafer 60X according to a Comparative Example, serving as a comparison to each exemplary embodiment of the technology disclosed herein. In the support substrate-attached wafer 60X according to the Comparative Example, a recessed portion 13 is formed to a peripheral edge portion of a device wafer 10, and a low adhesion layer 43 is formed at an inner peripheral portion of a support substrate 40. In these points, the support substrate-attached wafer 60X is similar to the support substrate-attached wafers according to each exemplary embodiment of the technology disclosed herein. However, the support substrate 40 side of the support substrate-attached wafer 60X according to the Comparative Example is formed without the recessed portion 42 or the adhesion layer 44 of exemplary embodiments of the technology disclosed herein, as illustrated such as in FIG. 8B. In the support substrate-attached wafer 60X according to the Comparative Example, an adhesive 30 that is interposed between the device wafer 10 and the support substrate 40 is filled into a space formed by the recessed portion 13 on the device wafer 10 side.

Figure 14B:
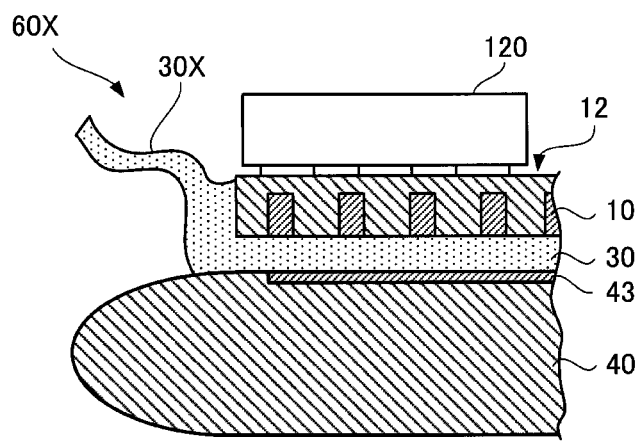
FIG. 14B is a cross-section view illustrating grinding processing of the support substrate-attached wafer according to the Comparative Example.

FIG. 14B is a cross-section view illustrating a state in which the support substrate-attached wafer 60X according to the Comparative Example illustrated in FIG. 14A has been ground from a second face 12 side of the device wafer 10. As illustrated in FIG. 14B, the device wafer 10 is thinned to a desired thickness by back grinding treatment, in which a grinding wheel 120 is brought into contact with the second face 12 and mechanical grinding is performed, similarly to in exemplary embodiments of the technology disclosed herein. When the ground face reaches the bottom face of the recessed portion 13 of the device wafer 10, and the adhesive 30 is exposed at the ground face, the adhesive 30 is ground together with the device wafer 10.

In the support substrate-attached wafer 60X according to the Comparative Example, since the support substrate 40 side is not provided with the recessed portion 42 according to exemplary embodiments of the technology disclosed herein, as illustrated such as in FIG. 8B, a support face of sufficient size to support the adhesive 30 at a peripheral edge portion of the support substrate 40 is not secured. Therefore, the adhesion between the support substrate 40 and the adhesive 30 is low at the peripheral edge portion of the support substrate-attached wafer 60X according to the Comparative Example. As a result, as illustrated in FIG. 14B, when the ground face reaches the adhesive 30 and friction force is applied to the adhesive 30, a phenomenon frequently occurs in which the adhesive 30 detaches from the support substrate 40, creating a long, thin, fibrous detached flap 30X of adhesive. The detached flap 30X of adhesive intrudes between the grinding wheel 120 and the ground face of the device wafer 10, causing abnormal grinding, and causing damage to the device wafer 10. Namely, chipping and scratch marks on the device wafer 10 occur as a result of the detached flap 30X of the adhesive 30.

Moreover, when the adhesive 30 detaches at the peripheral edge portion of the support substrate-attached wafer 60X, water supplied from the back grinding device penetrates between the adhesive 30 and the device wafer 10, and between the adhesive 30 and the support substrate 40. Due to the ingress of water, force acts to push up the ground face of the device wafer 10 toward the grinding wheel 120 side, causing an increase in friction force of the grinding, and abnormal grinding to occur as a result. In this mode, delamination of the adhesive 30 propagates as far as an inner peripheral portion of the device wafer 10, and ultimately the support substrate 40 detaches completely from the device wafer 10, leading to breakage of the device wafer 10 that has lost its support during grinding processing. In particular, adhesive delamination is likely to occur at the inner peripheral portion in structures that have the low adhesion layer 43 at the inner peripheral portion of the support substrate 40, increasing the possibility of breakage of the device wafer 10.

In the support substrate-attached wafer 60X according to the Comparative Example, the present inventor has observed that issues such as chipping and breakage of the device wafer 10 occur frequently during grinding of the device wafer 10. Moreover, the present inventor has also observed that phenomena such as chipping, and breakage of the device wafer 10 occur as a result of the adhesive 30 detaching, and the detached flap 30X of the adhesive being generated. Furthermore, the present inventor has also observed that detaching of the adhesive 30 to generate the detached flap 30X of the adhesive is caused by insufficient adhesion between the adhesive 30 and the support substrate 40, relative to the friction force during grinding.

In contrast thereto, according to the manufacturing method of each exemplary embodiment of the technology disclosed herein, the recessed portion 42 is provided on the support substrate 40 side at the peripheral edge portion of the support substrate-attached wafers 60, 60A, 60B, 60C. As a result, the contact surface area between the adhesive 30 and the support substrate 40 at the peripheral edge portion of the support substrate-attached wafers 60, 60A, 60B, 60C is larger than that of the support substrate-attached wafer 60X according to the Comparative Example. The adhesion between the adhesive 30 and the support substrate 40 at the peripheral edge portion of the support substrate-attached wafers 60, 60A, 60B, 60C according to each of the exemplary embodiments of the technology disclosed herein is thereby increased compared to the Comparative Example, preventing the adhesive 30 from detaching and generating the detached flap of adhesive during grinding.

One aspect of technology disclosed herein exhibits an advantageous effect of suppressing occurrence of cracking and scratch marks or similar on a device wafer when grinding is performed with the device wafer adhered to a support substrate by an adhesive.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device manufacturing method, comprising:
  forming a first recessed portion around an outer edge of a device wafer, at a peripheral edge portion of a first face of the device wafer;

forming a second recessed portion around an outer edge of a support substrate, at a bonding face of the support substrate;

bonding together the first face of the device wafer and the bonding face of the support substrate via an adhesive; and grinding the device wafer from a second face side that is at an opposite side to the first face as far as a depth position that reaches a bottom face of the first recessed portion.

2. The manufacturing method of claim 1, further comprising forming a first adhesion layer, that increases adhesion with respect to the adhesive, at a surface of the second recessed portion.

3. The manufacturing method of claim 2, further comprising forming a second adhesion layer, that increases adhesion with respect to the adhesive, at a surface of the first recessed portion.

4. The manufacturing method of claim 3, wherein the first adhesion layer and the second adhesion layer include a silane coupling agent.

5. The manufacturing method of claim 1, further comprising forming a low adhesion layer that has reduced adhesion with respect to the adhesive and that is disposed further inward of the bonding face of the support substrate than the second recessed portion.

6. The manufacturing method of claim 1, wherein:
the first recessed portion is formed by partially removing a region that includes an end face of the outer edge of the device wafer; and
the second recessed portion is formed by partially removing a region that includes an end face of the outer edge of the support substrate.

7. The manufacturing method of claim 1, wherein the second recessed portion includes a plurality of grooves provided around the outer edge of the support substrate.

8. The manufacturing method of claim 1, wherein:
the first recessed portion is formed by partially removing a region that is further inward than an end face that forms the outer edge of the device wafer; and
the second recessed portion is formed by partially removing a region that is further inward than an end face that forms the outer edge of the support substrate.

9. The manufacturing method of claim 1, further comprising separating the support substrate from the device wafer after the device wafer has been ground.

10. The manufacturing method of claim 1, wherein the first recessed portion is formed by removing a beveled portion of the device wafer at the first face side.

* * * * *